United States Patent
Ryu et al.

(10) Patent No.: US 8,604,478 B2
(45) Date of Patent: Dec. 10, 2013

(54) THIN-FILM TRANSISTOR SUBSTRATE, METHOD OF MANUFACTURING THE SAME AND DISPLAY APPARATUS HAVING THE SAME

(75) Inventors: Hye-Young Ryu, Seoul (KR); Jang-Soo Kim, Yongin-si (KR); Su-Hyoung Kang, Bucheon-si (KR)

(73) Assignee: Samsung Display Co., Ltd. (KR)

( * ) Notice: Subject to any disclaimer, the term of this patent is extended or adjusted under 35 U.S.C. 154(b) by 33 days.

(21) Appl. No.: 13/168,769

(22) Filed: Jun. 24, 2011

(65) Prior Publication Data

US 2011/0254007 A1  Oct. 20, 2011

Related U.S. Application Data

(62) Division of application No. 11/840,161, filed on Aug. 16, 2007, now Pat. No. 7,977,677.

(30) Foreign Application Priority Data

Aug. 18, 2006 (KR) .............................. 10-2006-77931

(51) Int. Cl.
*H01L 29/04* (2006.01)
(52) U.S. Cl.
USPC ......... 257/59; 257/72; 257/222; 257/E33.065
(58) Field of Classification Search
USPC ............................. 257/59, 72, 222, E33.064
See application file for complete search history.

(56) References Cited

U.S. PATENT DOCUMENTS

| | | | |
|---|---|---|---|
| 6,011,274 A | 1/2000 | Gu et al. | |
| 6,060,714 A * | 5/2000 | Zhong et al. | 250/370.09 |
| 6,365,916 B1 | 4/2002 | Zhong et al. | |
| 6,717,638 B1 | 4/2004 | Kim | |
| 2003/0086046 A1* | 5/2003 | You | 349/149 |
| 2004/0145687 A1 | 7/2004 | Kim | |
| 2004/0247949 A1 | 12/2004 | Akedo et al. | |
| 2004/0263724 A1 | 12/2004 | Kim et al. | |
| 2005/0051772 A1 | 3/2005 | Kawasaki et al. | |
| 2005/0139751 A1* | 6/2005 | Park et al. | 250/208.1 |

FOREIGN PATENT DOCUMENTS

| | | |
|---|---|---|
| JP | 01-124824 | 5/1989 |
| KR | 1020040110751 | 12/2004 |
| WO | 2005047968 | 5/2005 |

OTHER PUBLICATIONS

European Patent Office, Extended European Search Report EP 07 01 5870, Feb. 28, 2012, 8 pages.

* cited by examiner

*Primary Examiner* — Dale E Page
(74) *Attorney, Agent, or Firm* — Innovation Counsel LLP

(57) ABSTRACT

In a thin-film transistor (TFT) substrate, a gate insulating layer is disposed on a gate electrode electrically connected to a gate line. A semiconductor layer is disposed on the gate insulating layer. A source electrode is electrically connected to a data line that intersects the gate line. A drain electrode faces the source electrode and defines a channel area of a semiconductor layer. An organic layer is disposed on the data line and has a first opening exposing the channel area. An inorganic insulating layer is disposed on the organic layer. A pixel electrode is disposed on the inorganic insulating layer and electrically connected to the drain electrode. The inorganic insulating layer covers the first opening, and thickness of the inorganic insulating layer is substantially uniform.

8 Claims, 11 Drawing Sheets

THIN-FILM TRANSISTOR SUBSTRATE, METHOD OF MANUFACTURING THE SAME AND DISPLAY APPARATUS HAVING THE SAME

CROSS-REFERENCE TO RELATED APPLICATIONS

This application is a divisional of U.S. patent application Ser. No. 11/840,161 filed Aug. 16, 2007, which claims priority under 35 U.S.C. §119 to Korean Patent Application No. 10-2006-77931, filed on Aug. 18, 2006 in the Korean Intellectual Property Office (KIPO), the disclosures of which are incorporated herein by reference in their entireties.

BACKGROUND OF THE INVENTION

1. Field of the Invention

The present invention relates to a display apparatus and, more particularly, to a TFT substrate, a method of manufacturing the TFT substrate and a display apparatus having the TFT substrate.

2. Description of the Related Art

Recently, flat panel display apparatus, such as the organic light-emitting display (OLED), the plasma display panel (PDPs) and the liquid crystal display (LCD) have been developed to substitute for heavy and large cathode ray tube (CRT) displays. The PDP apparatus displays images using plasma generated by an electric discharge. The OLED apparatus displays images and characters using organic electroluminescence of a specific organic material and a polymer. The LCD apparatus displays images by controlling the transmissivity of light passing through a liquid crystal layer.

In general, the LCD apparatus includes a thin-film transistor (TFT) substrate, a common electrode substrate and a liquid crystal layer disposed between the TFT substrate and the common electrode substrate. When the TFT substrate and the common electrode substrate are misaligned during the manufacturing process for the LCD apparatus, the display quality of the LCD apparatus is adversely affected.

In order to prevent the display quality from being affected by the misalignment, a color filter on array (COA) structure may be employed in which a color filter is disposed on the TFT substrate. However, impurities from the color filter may elute through a gap or an opening between pixel electrodes, contaminate the liquid crystal and cause an afterimage to be displayed.

Furthermore, when an organic insulating layer is used as a planarization layer under the pixel electrode, impurities from the organic insulating layer elute. As a result, the liquid crystal is also contaminated, and the afterimage increases.

SUMMARY OF THE INVENTION

According to one aspect of the present invention, a thin film transistor (TFT) substrate capable of reducing defects such as an afterimage, includes a gate electrode, a gate insulating layer, a semiconductor layer, a source electrode, a drain electrode, an organic layer, an inorganic insulating layer and a pixel electrode. The gate electrode is formed on the substrate, and is electrically connected to a gate line. The gate insulating layer is formed on the substrate to cover the gate line and the gate electrode. The semiconductor layer is formed on the gate insulating layer corresponding to the gate electrode. The source electrode is electrically connected to a data line formed on the gate insulating layer in a direction crossing a longitudinal direction of the gate line. The source electrode is on the semiconductor layer. The drain electrode is formed on the semiconductor layer, and is opposite to the source electrode to define a channel area of the semiconductor layer between the source and drain electrodes. The organic layer is formed on the gate insulating layer to cover the source electrode, the drain electrode, and the data line. The organic layer has a first opening exposing the channel area. The inorganic insulating layer is formed on the organic layer and an inner surface of the first opening, and has a substantially uniform thickness. The pixel electrode is disposed on the inorganic insulating layer and electrically connected to the drain electrode.

According to a method of manufacturing a TFT substrate is provided as follows. A gate line and a gate electrode electrically connected to the gate line are formed on a substrate. A gate insulating layer is formed on the substrate to cover the gate line and the gate electrode. A semiconductor layer is formed on the gate insulating layer corresponding to the gate electrode. A data line is formed on the gate insulating layer in a direction crossing an extended direction of the gate line, and a source electrode electrically connected to the data line and a drain electrode opposite to the source electrode are formed on the semiconductor layer to define a channel area of the semiconductor layer between the source and drain electrodes. An organic layer is formed on the gate insulating layer to cover the data line, the source electrode, and the drain electrode, and has a first opening exposing the channel area. An inorganic insulating layer is formed on the organic layer and an inner surface of the first opening, and has a substantially uniform thickness. A pixel electrode is formed on the inorganic insulating layer, and is electrically connected to the drain electrode.

According to still another aspect of the present invention, the display apparatus includes a first substrate, a gate electrode, a gate insulating layer, a semiconductor layer, a source electrode, a drain electrode, an organic layer, an inorganic insulating layer, a pixel electrode, and a second substrate. The gate electrode is disposed on the first substrate, and is electrically connected to a gate line. The gate insulating layer is disposed on the first substrate to cover the gate line and the gate electrode. The semiconductor layer is disposed on the gate insulating layer corresponding to the gate electrode. The source electrode is electrically connected to a data line formed on the gate insulating layer in a direction crossing a longitudinal direction of the gate line, and is on the semiconductor layer. The drain electrode is formed on the semiconductor layer, and is opposite to the source electrode to define a channel area of the semiconductor layer between the source and drain electrodes. The organic layer is disposed on the gate insulating layer to cover the source electrode, the data line, and the drain electrode. The organic layer has a first opening for exposing the channel area. The inorganic insulating layer is disposed on the organic layer and an inner surface of the first opening, and has a substantially uniform thickness. The pixel electrode is disposed on the inorganic insulating layer and electrically connected to the drain electrode. The second substrate faces the first substrate and including a common electrode.

According to an aspect of the present invention, an inorganic insulating layer is disposed on an organic layer. Thus, impurities from the organic layer may be blocked, so that liquid crystal may be prevented from being contaminated and display defects, such as afterimages, may be reduced.

According to a method of manufacturing a TFT substrate of the present invention, an inorganic insulating layer is formed at a low temperature of about 100° C. to about 250° C.

Thus, damage to a lower organic layer may be prevented and display properties may be enhanced.

Additionally, according to a method of manufacturing a TFT substrate of the present invention, manufacturing time may be shortened by forming an inorganic insulating layer having a precise thickness.

BRIEF DESCRIPTION OF THE DRAWINGS

The above and other advantages of the present invention will become readily apparent by reference to the following detailed description when considered in conjunction with the accompanying drawings, in which.

DESCRIPTION OF THE EMBODIMENTS

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Hereinafter, the present invention will be explained in detail with reference to the accompanying drawings.

Figure 1:
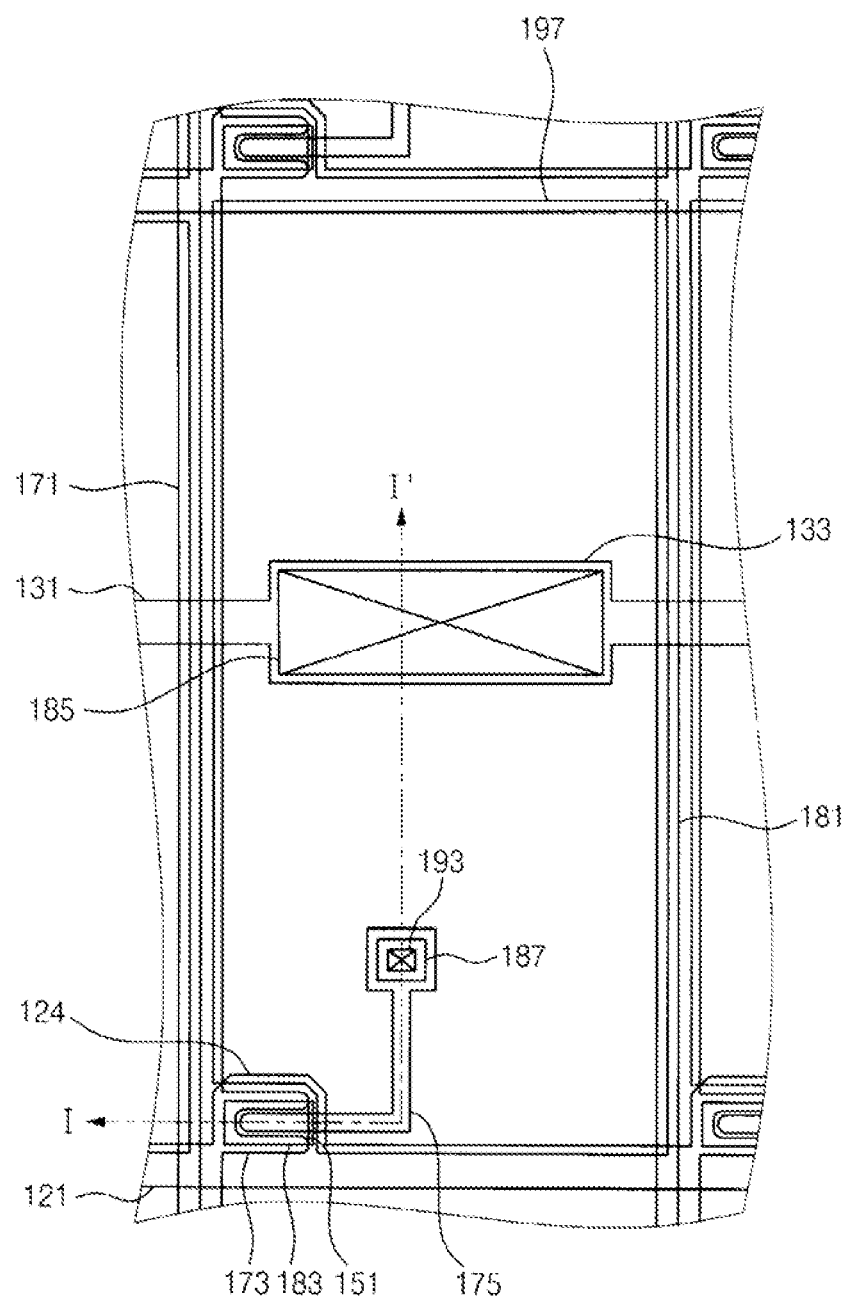
FIG. 1 is a plan view illustrating a portion of a thin-film transistor (TFT) substrate in accordance with a first example embodiment of the present invention.
Figure 2:
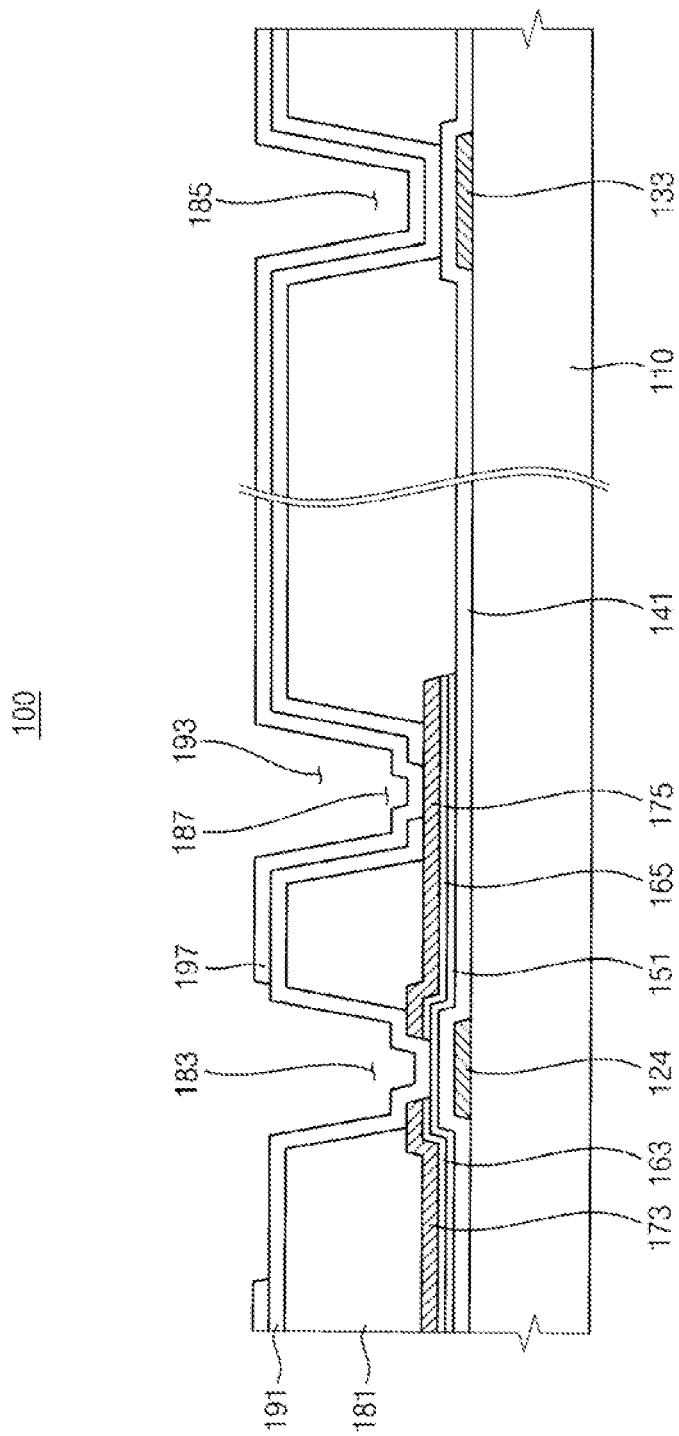
FIG. 2 is a cross-sectional view taken along a line I-I' in FIG. 1.

FIG. 1 is a plan view illustrating a portion of a thin-film transistor (TFT) substrate in accordance with a first example embodiment of the present invention, and FIG. 2 is a cross-sectional view taken along a line I-I' in FIG. 1.

Referring to FIGS. 1 and 2, a plurality of gate lines 121 is disposed on an insulating substrate 110. The insulating substrate 110 includes, for example, a transparent glass or a polymer.

The gate lines 121 are disposed along a horizontal direction and transmit gate signals. Each of the gate lines 121 includes a gate electrode 124 and a gate pad (not shown). The gate electrode 124 protrudes from the gate lines 121 along a direction that is substantially perpendicular to the longitudinal direction of the gate lines 121. The gate pad is disposed on an end portion of the gate lines so as to be electrically connected to a conductive pattern formed from a different layer or an external driving circuit.

A storage line 131 including a storage electrode 133 is formed from substantially the same layer as the gate lines 121. The storage electrode 133 may have various sizes and shapes as demands. For example, the storage electrode 133 in the present example embodiment may have a rectangular shape on a central portion of a pixel electrode.

Figure 3:
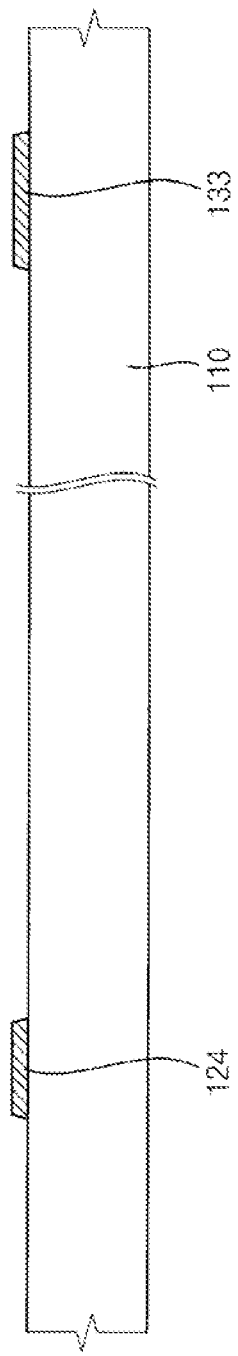
FIGS. 3 to 6 are cross-sectional views illustrating a method of manufacturing a TFT substrate shown in FIG. 1.

FIGS. 3 to 6 are cross-sectional views illustrating a method of manufacturing a TFT substrate shown in FIG. 1. FIG. 3 is a cross-sectional view illustrating a process for forming a gate electrode, gate lines, a storage line, and a storage electrode.

Referring to FIGS. 1 and 3, the gate lines 121, the gate electrode 124, the storage line 131, and the storage electrode 133 may be formed by the following method.

A conductive layer (not shown) is formed on an insulating substrate 110. The insulating substrate 110 includes a transparent glass or a polymer. The gate lines 121, the gate electrode 124, the storage line 131, and a storage electrode 133 are formed by dry etching or wet etching the conductive layer.

For example, the gate lines 121 and the storage line 131 include a conductive material such as a metal. Examples of the conductive material that can be used for the gate lines 121 and the storage line 131 may include aluminum (Al), aluminum alloy, silver (Ag), silver alloy, copper (Cu), copper alloy, molybdenum (Mo), molybdenum alloy, chrome (Cr), tantalum (Ta), titanium (Ti), etc. These can be used alone or in combination. In addition, the gate lines 121 and the storage line 131 may include a multi-layered structure having more than two conductive layers (not shown) having different physical characteristics.

Referring again to FIGS. 1 and 2, a gate insulating layer 141 is formed on the gate lines 121. Examples of an insulating material that can be used for the gate insulating layer 141 include silicon nitride (SiNx), silicon oxide (SiOx), etc. A channel layer including a semiconductor layer 151 and ohmic contact members 163 and 165 are formed on the gate insulating layer 141. The semiconductor layer 151 having hydrogenated amorphous silicon is disposed on the gate insulating layer 141. The semiconductor layer 151 includes a protruding portion that overlaps the gate electrode 124 and a linear portion that overlaps the data line 171.

The ohmic contact members 163 and 165 are disposed on the semiconductor layer 151. The ohmic contact members 163 and 165 are disposed between the semiconductor layer 151 and a source electrode 173. The ohmic contact members 163 and 165 decrease electric contact resistance between the semiconductor layer 151 and the source electrode 173. The ohmic contact members 163 and 165 are also disposed between the semiconductor layer 151 and a drain electrode 175. The ohmic contact members 163 and 165 decrease electric contact resistance between the semiconductor layer 151 and the drain electrode 175.

The data line 171 and the drain electrode 175 are disposed on the ohmic contact members 163 and 165.

The data line 171 transmits data signals and is mainly disposed along a substantially perpendicular direction to intersect the gate lines 121. The data line 171 is electrically connected to the source electrode 173 and a data pad (not shown). The source electrode 173 protrudes toward the gate electrode 124. The data pad connected to the conductive pattern formed from the different layer or the external driving circuit is disposed on the end portion of the data line 171. The drain electrode 175 is separated from the data line 171, and faces the source electrode 173 electrically connected to the gate electrode 124. The gate electrode 124 is disposed between the drain electrode 175 and the source electrode 173 when viewed on a plane.

The TFT includes the gate electrode 124, the source electrode 173, the drain electrode 175 and a protruding portion of the semiconductor layer 151. A channel of the TFT is formed between the source electrode 173 and the drain electrode 175.

The semiconductor layer 151 has substantially the same shape as the area defined by the data line 171, the drain electrode 175 and ohmic contact layers 163 and 165 under the data line 171 and the drain electrode 175, except for the protruding portion having the TFT. For example, the semiconductor layer 151 is disposed under the data line 171, the drain electrode 175 and ohmic contact layers 163 and 165 that are under the data line 171 and the drain electrode 175. The semiconductor layer 151 is exposed between the source electrode 173 and the drain electrode 175. The ohmic contact layers 163 and 165 have a substantially same shape as an area defined by the data line 171 and the drain electrode 175 when viewed on the plane.

Figure 4:
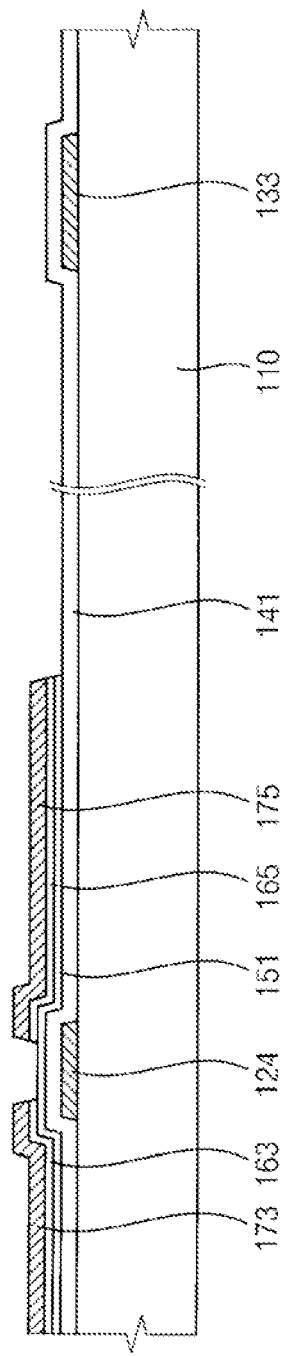

FIG. 4 is a cross-sectional view illustrating a process for forming a semiconductor layer, ohmic contact members, a data line, a source electrode and a drain electrode on the TFT substrate in FIG. 3.

Referring to FIGS. 1 and 4, the semiconductor layer 151, the ohmic contact members 163 and 165, the data line 171, the source electrode 173 and the drain electrode 175 are formed by the following method.

A silicon nitride layer (not shown), an amorphous silicon layer (not shown) and a doped amorphous silicon layer (not shown) are formed on an insulating layer having a gate line and a storage electrode line formed thereon. For example, the silicon nitride layer (not shown), the amorphous silicon layer (not shown) and the doped amorphous silicon layer (not shown) are formed by a chemical vapor deposition (CVD) method. Then, a conductive layer (not shown) is disposed on the doped amorphous silicon layer by a sputtering method. A photosensitive material is deposited on the conductive layer to form a photosensitive film. The photosensitive material is partially exposed to light. As a result, a first photosensitive pattern (not shown) having a first portion having a first thickness and a second portion having a second thickness that is thinner than the first thickness is formed.

The conductive layer is etched to form a data line pattern (not shown) by dry etching or wet etching by using the first photosensitive pattern as an etching mask. The doped amorphous silicon layer and the amorphous silicon layer are etched to form an ohmic contact pattern (not shown) and the semiconductor layer 151 by dry etching or wet etching using the first photosensitive pattern as an etching mask.

The first photosensitive pattern is etched by a predetermined thickness to form a second photosensitive pattern (not shown) exposing a channel area. The data line pattern is etched by dry etching or wet etching to form the data line 171, the source electrode 173 and the drain electrode 175 by using the second photosensitive pattern as an etching mask.

After removing the second photosensitive pattern, the doped amorphous silicon layer is etched by dry etching or wet etching to form the ohmic contact members 163 and 165. Alternatively, before removing the second photosensitive pattern, the doped amorphous silicon layer may be etched by dry etching or wet etching to form the ohmic contact members 163 and 165, and the second photosensitive pattern may be removed.

Referring again to FIGS. 1 and 2, a color filter 181 is formed on the insulating substrate 110 having the source electrode 173 and the drain electrode 175 formed thereon. The color filter 181 covers the data line 171, the drain electrode 175 and the gate insulating layer 141. For example, the color filter 181 may include an organic layer. The organic layer may include a pigment for displaying a color, and a photosensitive organic material. For example, the organic layer includes a photosensitive organic material having red, green or blue pigment.

For example, the color filters 181 having substantially the same color are aligned along the data line 171. The color filters 181 having different colors are aligned along the gate line 121. Alternatively, the color filters 181 having substantially the same color may be connected with each other to form a belt-shape. The color filters 181 having different colors may be disposed such that edge portions of adjacent color filters 181 may overlap each other on the data line 171. Alternatively, the color filters 181 having substantially the same color may be disposed to correspond to a pixel area to have an island shape, and the color filters 181 having the same color may overlap an adjacent color filter 181 having a different color on the data line 171.

The color filter 181 has a first opening 183 disposed on the channel area, a second opening 185 corresponding to the storage electrode 133 and a third opening 187 disposed on the drain electrode 175 and exposing the drain electrode 175.

When the color filter 181 is disposed on the channel area, impurities from the color filter 181 may elute toward the channel area, thereby deteriorating electrical characteristics of the TFT. However, in FIG. 4, the color filter has the first opening 183 exposing the channel area. Also, an inorganic insulating layer 191 having an insulating material covers the first opening 183. Examples of the insulating material that can be used for the inorganic insulating layer 191 include silicon nitride (SiNx), silicon oxide (SiOx), etc. These can be used alone or in a combination. As a result, the electrical characteristics of the TFT are enhanced. The inorganic insulating layer 191 is formed by the following process.

Figure 5:
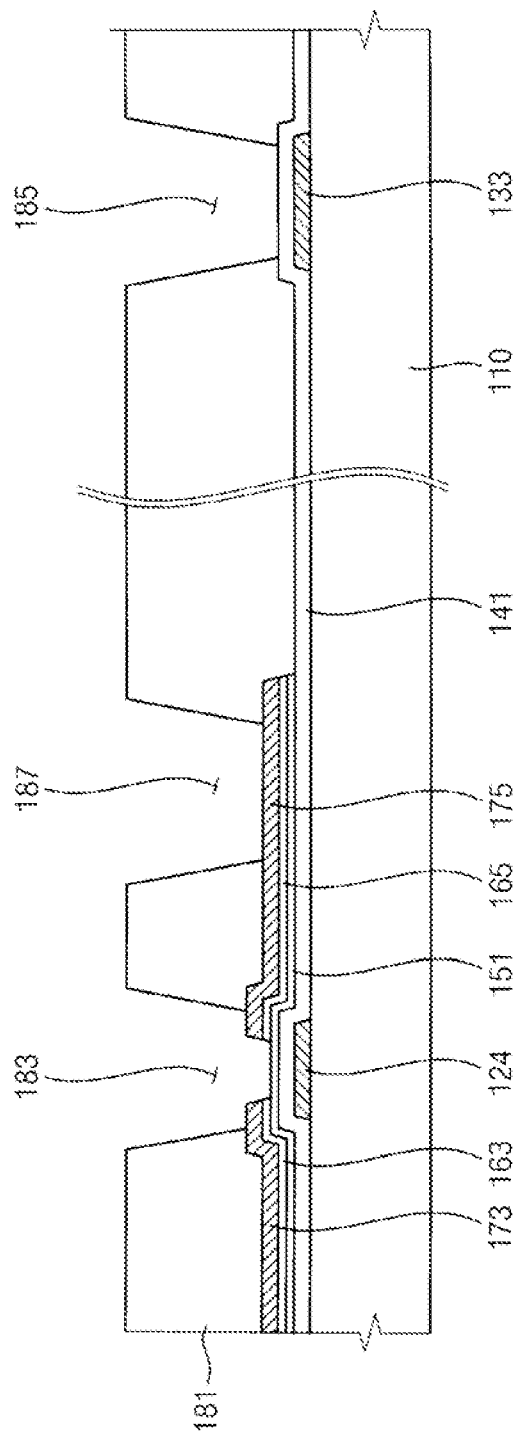

FIG. 5 is a cross-sectional view illustrating a process for forming a color filter on the TFT substrate in FIG. 4.

Referring to FIGS. 1 and 5, the color filter 181 is formed by the following process. For example, a preliminary color filter layer (not shown), or a preliminary organic layer is formed on the insulating substrate 110 having a data line 171 formed thereon by a slit coating method or a spin coating method. The preliminary color filter layer or a preliminary organic layer has a thickness ranging from about 2.5 μm to about 3.5 μm.

The preliminary color filter layer or a preliminary organic layer is exposed to light and is developed to form a color filter such as a red color filter having the first opening 183, the second opening 185 and the third opening 187.

A color filter having a different color such as green or blue is formed by the same method as described above.

After forming the red, green and blue color filters, a plasma treatment process is performed on the insulating substrate 110. For example, the substrate having color filters formed thereon is disposed in a chamber, and plasma is generated in the chamber with a supply gas such as hydrogen ($H_2$) or ammonia ($NH_3$). The plasma process is performed for about 20 seconds to about 60 seconds and with power ranging from about 300 W to about 600 W. Through the plasma process, impurities in the channel area may be removed. Thus, electrical characteristics of the TFT may be enhanced.

In general, when the impurities from the color filter having a photosensitive organic material elute through an opening of pixel electrode, an afterimage may be displayed. In order to prevent the afterimage, the inorganic insulating layer 191 is formed on the color filter 181.

Referring again to FIGS. 1 and 2, the inorganic insulating layer 191 is formed on the color filter 181. For example, the inorganic insulating layer 191 covers an entire of an upper surface of the color filter 181 as well as inner surfaces of the first opening 183 and the second opening 185 of the color filter 181. For example, the inorganic insulating layer 191 includes a material having a low reaction rate with an organic material, and prevents impurities from eluting. Examples of the material that can be used for the inorganic insulating layer 191 include silicon nitride (SiNx), silicon oxide (SiOx), etc. For example, the color filter material and the organic insulating material may be decomposed at a low temperature to generate the impurities. However, the material such as silicon nitride (SiNx) or silicon oxide (SiOx) is thermally more stable than the organic material or the color filter material. Thus, display quality may be enhanced.

The inorganic insulating layer 191 is disposed on the color filter 181 to have thin and uniform thickness. For example, when the inorganic insulating layer 191 is disposed at a step portion, the thickness on the step portion may be slightly thinner or thicker than adjacent portions. The inorganic insulating layer 191 corresponds to a profile of the step portion of the color filter 181 under the inorganic insulating layer 191.

For example, the inorganic insulating layer 191 has a predetermined stepped portion according to a shape under the inorganic insulating layer 191. The inorganic insulating layer 191 covers the first and second openings 183 and 185 of the color filter 181 and has a step portion along the first and second openings 183 and 185. A profile of the step portion is substantially the same as those of the first and second openings 183 and 185.

The inorganic insulating layer 191 covers a channel area disposed in a gap of the first opening 183 of the color filter 181 and enhances the electrical characteristics of the TFT. Additionally, the inorganic insulating layer 191 has an opening 193 disposed on a portion of the drain electrode 175.

Figure 6:
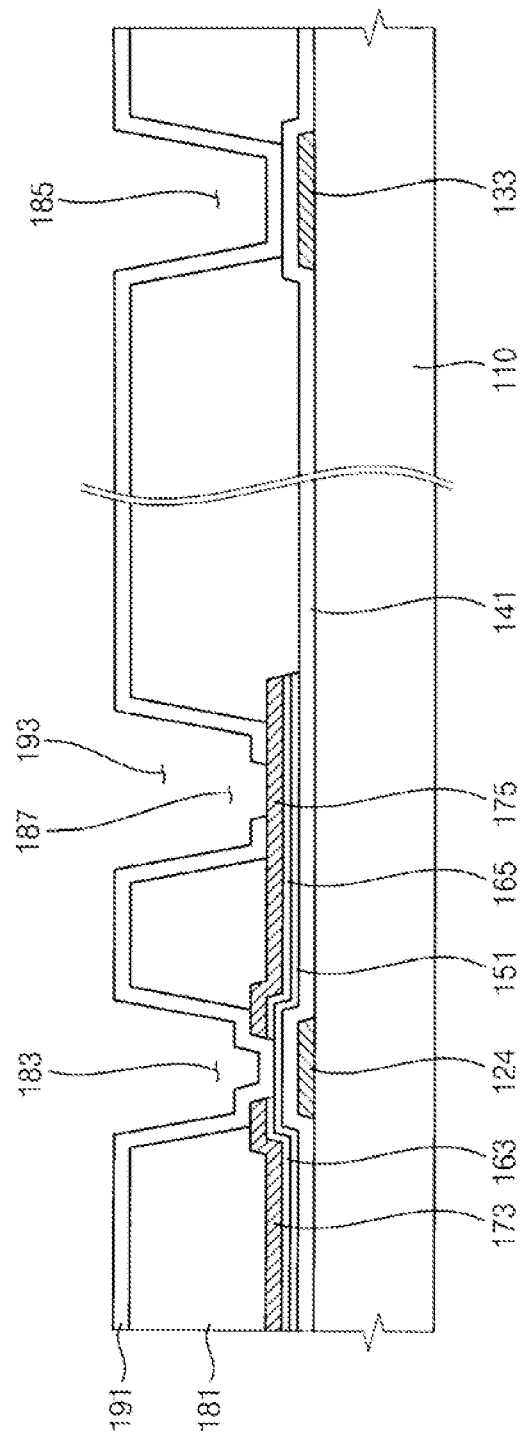

FIG. 6 is a cross-sectional view illustrating a process for forming an inorganic insulating layer 191 on the TFT substrate in FIG. 5.

Referring to FIGS. 1 and 6, the inorganic insulating layer 191 is formed by the following method.

The inorganic insulating layer 191 is formed on the insulating substrate 110 having the color filter 181 formed thereon by a process such as a chemical vapor deposition (CVD) process. Examples of an inorganic insulating material that can be used for the inorganic insulating layer 191 include silicon nitride (SiNx), silicon oxide (SiOx), etc. The above-mentioned process is performed at a temperature from about 100° C. to about 250° C. For example, the above-mentioned process is performed at a temperature from about 100° C. to about 200° C. When the temperature is higher than about 250° C., the color filter 181 disposed under the inorganic insulating layer 191 may be thermally resolved and damaged. When the temperature is lower than about 100° C., the deposition may be deteriorated.

In general, the inorganic insulating layer 191 is formed by a deposition process which takes long to form the inorganic insulating layer 191 having a thickness over about 1 μm. Thus, the inorganic insulating layer 191 has enough thickness to cover only the color filter 181. For example, the inorganic insulating layer 191 has a thickness about 100 Å to about 2,000 Å, and manufacturing costs and time thereof may be decreased.

A photosensitive material is deposited on a substrate having the inorganic insulating layer 191, for example, by a slit coating method or a spin coating method. The photosensitive material is exposed to light and is developed to form a photosensitive pattern. The inorganic insulating layer 191 is dry etched or wet etched by using the photosensitive pattern as an etching mask. As a result, an opening 193 exposes the drain electrode 175, and an opening (not shown) exposes a gate pad and a data pad. An opening may be also formed at the gate insulating layer 141 on the gate pad.

Referring again to FIGS. 1 and 2, the pixel electrode 197 is disposed on the inorganic insulating layer 191.

The pixel electrode is not formed at the first opening 183 formed through the color filter 181. The inorganic insulating layer 191 covers the first opening 183. When the pixel electrode 197 is formed in the first opening 183, a parasitic capacitor may be formed and electrical characteristics of the TFT may be deteriorated. In the first opening 183, when the thickness of the inorganic insulating layer 191 decreases, an electrical capacitance of the parasitic capacitor increases. Thus, the pixel electrode 197 may not be formed in the first opening 183.

The pixel electrode 197 formed in an area having the second opening 185 of the color filter 181 and the storage electrode 133 define a storage capacitor Cst with the inorganic insulating layer 191 and the gate insulating layer 141 interposed between the pixel electrode 197 and the storage electrode 133. When the second opening 185 is formed through the color filter 181 under which the storage electrode 133 is formed, a distance between the storage electrode 133 and the pixel electrode 197 is decreased. As a result, an electrical capacitance of the maintaining capacitor Cst may be increased. Thus, although an extra metal electrode is not formed between the storage electrode 133 and the pixel electrode 197, the maintaining capacitor Cst may have stable and sufficient electrical capacitance.

The pixel electrode 197 is electrically connected to the drain electrode 175 through the third opening 187 of the color filter 181 and the opening 193 of the inorganic insulating layer 191. The pixel electrode 197 covers the opening of the gate pad and the data pad.

For example, the pixel electrode 197 overlaps the gate line 121 and the data line 171. Alternatively, the pixel electrode 197 may not overlap the gate line 121 and the data line 171.

The pixel electrode 197 may be formed by the following method. A transparent conductive layer is disposed on the insulating substrate 110 having the inorganic insulating layer 191 by using a sputtering method. Examples of a transparent conductive material that can be used for the transparent conductive layer include indium zinc oxide (IZO), indium tin oxide (ITO), etc. These can be used alone or in a combination thereof.

Figure 7:
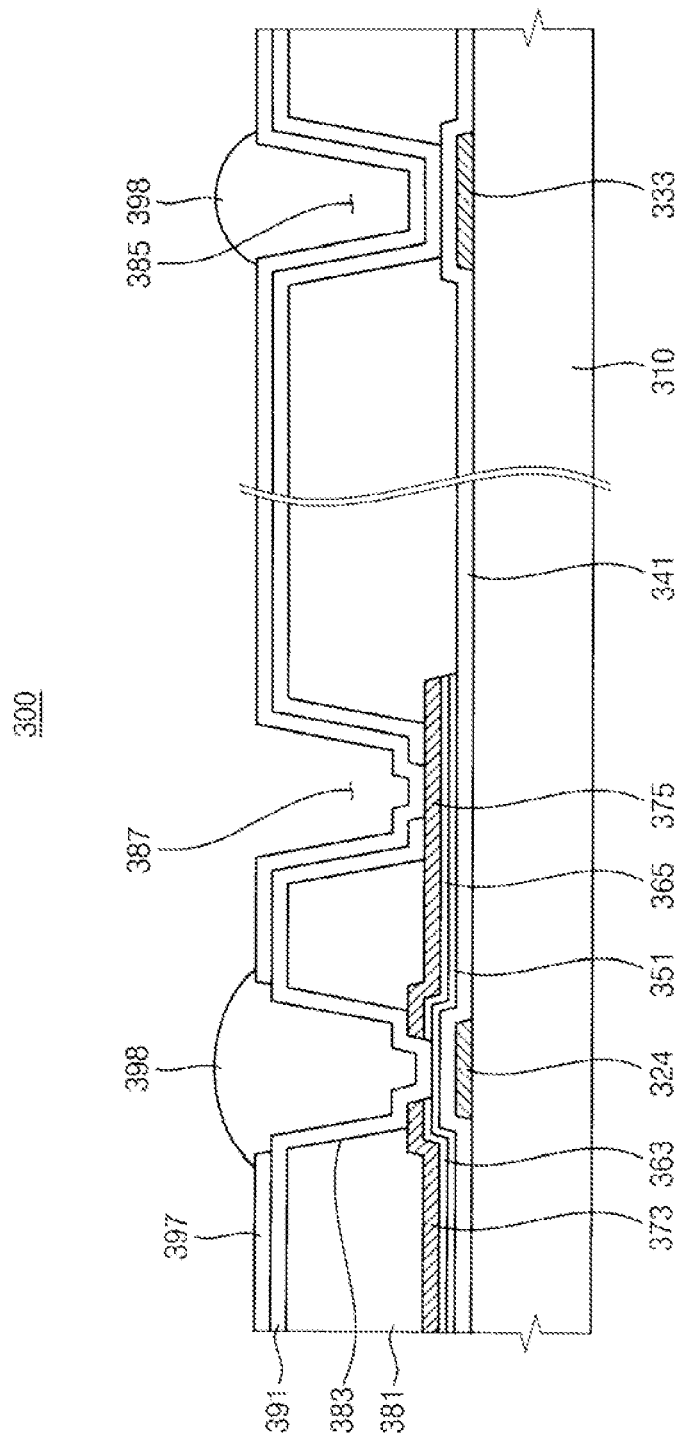
FIG. 7 is a cross-sectional view illustrating a TFT substrate in accordance with a second example embodiment of the present invention.

FIG. 7 is a cross-sectional view illustrating a TFT substrate in accordance with a second example embodiment of the present invention.

In FIG. 7, a TFT substrate in accordance with another example embodiment of the present invention will be explained.

Referring to FIG. 7, a TFT substrate 300 in accordance with a second example embodiment of the present invention has a first opening 383 of a color filter and a column spacer 398. The column spacer 398 is formed in a region where a second opening 385 of the color filter is formed. The column spacer 398 is disposed on a pixel electrode 397.

The column spacer 398 maintains a distance between the TFT substrate 300 and a common electrode substrate (not shown).

In addition, the column spacer 398 includes a light blocking material and prevents light from leaking through the first and second openings 383 and 385 of the color filter 381. As a result, display quality is enhanced.

The column spacer 398 having a light blocking material may also be formed in an area corresponding to a third opening 387 of the color filter 381.

Figure 8:
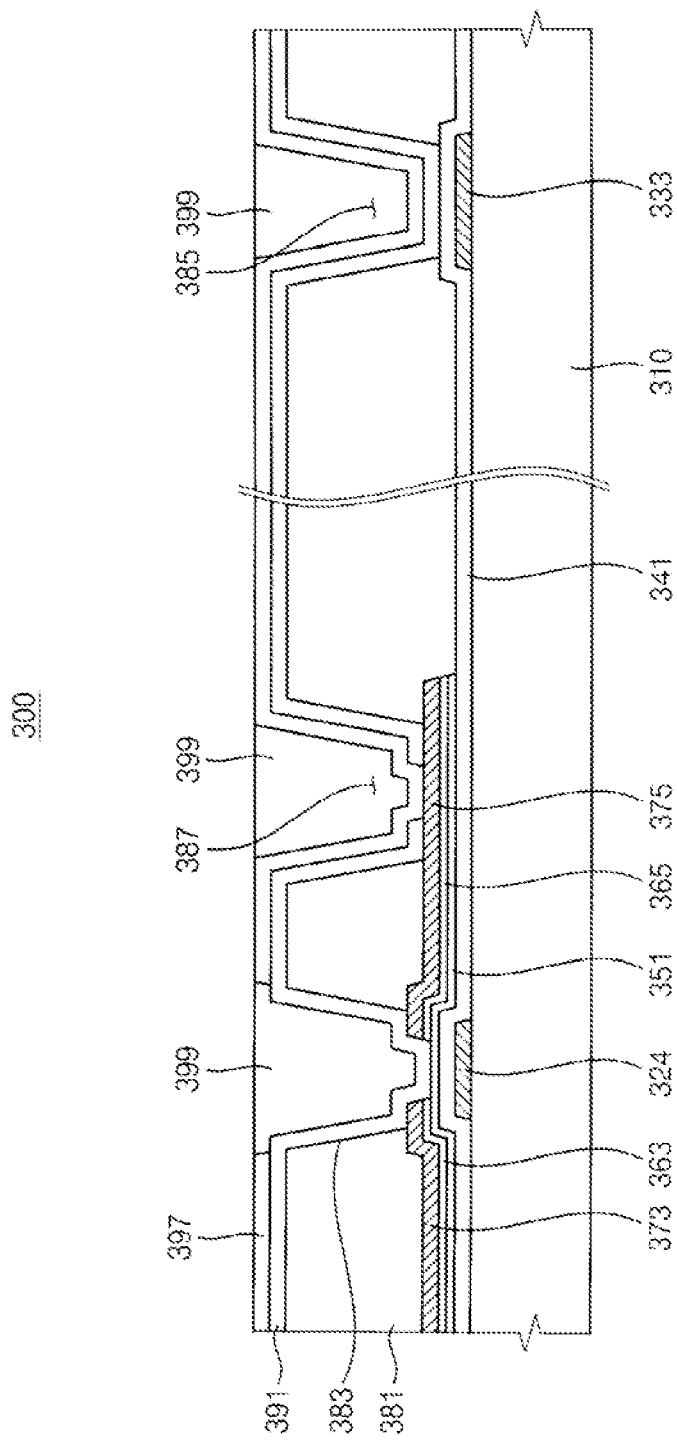
FIG. 8 is a cross-sectional view illustrating a TFT substrate in accordance with a third example embodiment of the present invention.

FIG. 8 is a cross-sectional view illustrating a TFT substrate in accordance with a third example embodiment of the present invention.

In FIG. 8, a TFT substrate in accordance with a third example embodiment of the present invention will be explained.

Referring to FIG. 8, a TFT substrate 300 includes a light blocking filler 399. A position of the light blocking filler 399 corresponds to a first opening 383 of a color filter, a second opening 385 of the color filter and a third opening 387 of the color filter.

The light blocking filler 399 blocks light, and prevents the light from being leaked through the first opening 383, the second opening 385 and the third opening 387, thereby enhancing display quality. For example, the light blocking filler 399 is disposed in at least one of the first openings 383, the second opening 385 and the third opening 387.

The light blocking filler 399 may be formed by an ink jet process. For example, a liquefied light blocking material is jetted into the openings of the color filter, and the liquefied light blocking material in the openings is solidified to form the light blocking filler 399.

Alternatively, after dispersing bead spacers on a liquefied light blocking material, the liquefied light blocking material having the bead spacers is jetted into the openings of the color filter by using an ink jet process. In that case, the liquefied light blocking material and the bead spacers are simultaneously arranged in the openings.

Figure 9:
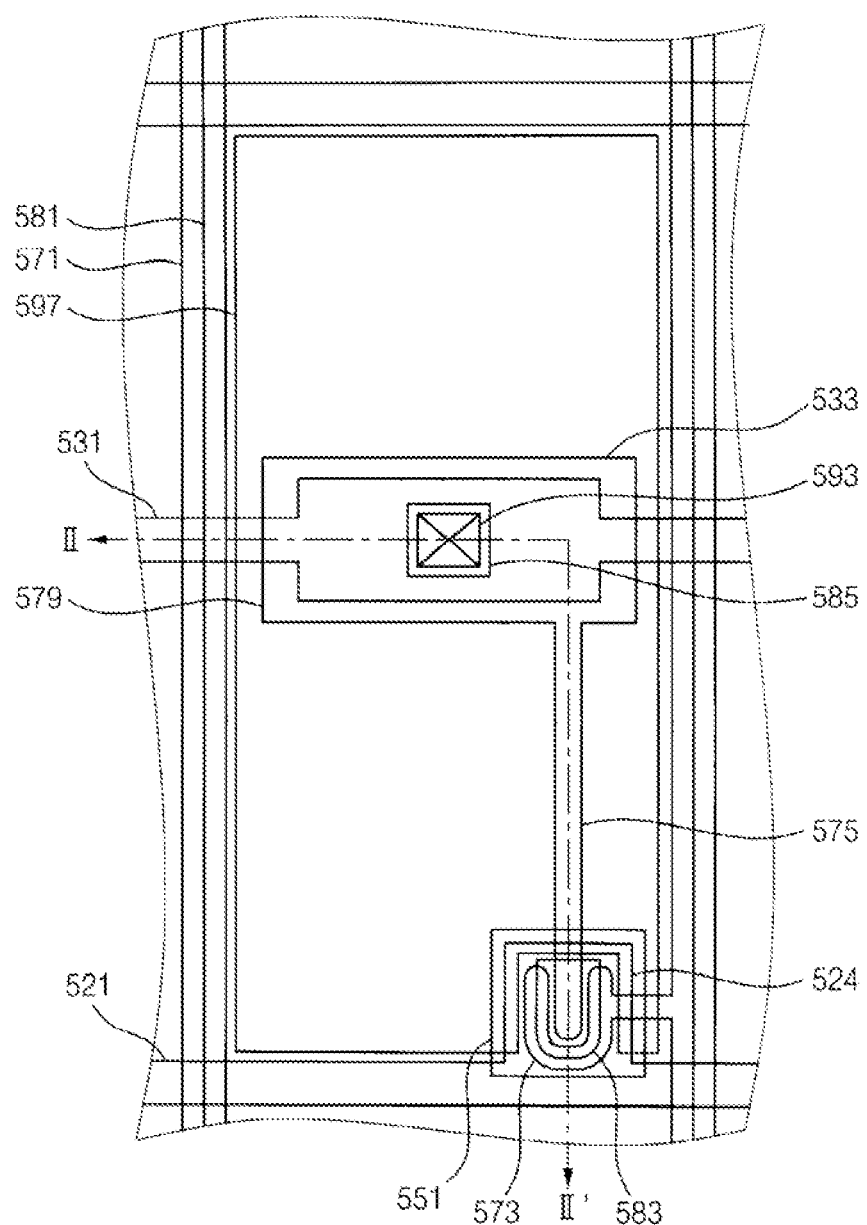
FIG. 9 is a plan view illustrating a portion of a TFT substrate in accordance with a fourth example embodiment of the present invention.
Figure 10:
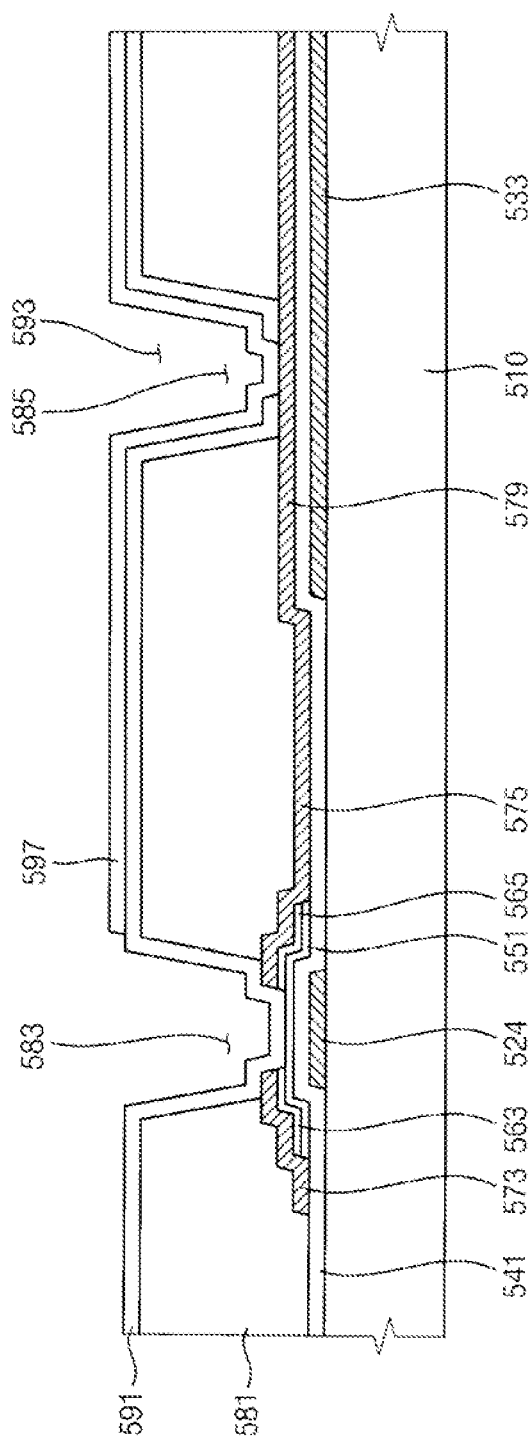
FIG. 10 is a cross-sectional view taken along a line II-II' in FIG. 9.

FIG. 9 is a plan view illustrating a TFT substrate in accordance with a fourth example embodiment of the present invention, and FIG. 10 is a cross-sectional view taken along the line II-II' in FIG. 9.

Referring to FIGS. 9 and 10, a plurality of gate lines 521 is formed on an insulating substrate 510. The insulating substrate 510, for example, includes a transparent glass or a polymer.

The gate lines 521 are formed along a horizontal direction and transmit gate signals. Each of the gate lines 521 is electrically connected to a plurality of gate electrodes 524 protruding from the gate lines 521 and a gate pad (not shown).

A storage line 531 including a storage electrode 533 is formed from a substantially same layer as the gate lines 521. The storage electrode 533 has various sizes and shapes. Alternatively, the storage electrode 533 may have a rectangular shape in a center of a pixel electrode.

The gate line 521 and the storage line 531 may include a conductive material such as a metal. A conductive layer (not shown) is formed on an insulating substrate 110. The insulating substrate 110 may include a transparent glass or a polymer. The gate lines 521, the gate electrode 524, the storage line 531 and the storage electrode 533 are formed by dry etching or wet etching the conductive layer.

A gate insulating layer 541 is disposed on the gate lines 521. Examples of an insulating material that can be used for the gate insulating layer 541 include silicon nitride (SiNx), silicon oxide (SiOx), etc. A semiconductor layer 551 having hydrogenated amorphous silicon is formed on the gate insulating layer 541.

The semiconductor layer 551 overlaps the gate electrode 524. For example, the semiconductor layer 551 has an island shape.

Ohmic contact members 563 and 565 are formed on the semiconductor layer 551. The ohmic contact members 563 and 565 are formed between the semiconductor layer 551 and the source electrode 573. The ohmic contact members 563 and 565 reduce electric resistance between the semiconductor layer 551 and the source electrode 573. The ohmic contact members 563 and 565 are also formed between the semiconductor layer 551 and the drain electrode 575. The ohmic contact members 563 and 565 reduce electric resistance between the semiconductor layer 551 and the drain electrode 575. For example, the ohmic contact members 563 and 565 overlap the semiconductor layer 551 and have an island shape. Meanwhile, the ohmic contact members 563 and 565 expose the semiconductor layer 551 disposed between the source electrode 573 and the drain electrode 575.

The data line 571 and the drain electrode 575 are disposed on the ohmic contact members 563 and 565.

The data line 571 transmits data signals and is formed along a direction crossing the gate lines 521. The data line 571 is electrically connected to the source electrode 573 and a data pad (not shown). The source electrode 573 is protruded toward the gate electrode 524. The data pad is disposed at an end portion of the data line 571 to be electrically connected to a conductive pattern formed from a different layer or an external driving circuit.

The drain electrode 575 is separated from the data line 571 and faces the source electrode 573 with respect to the gate electrode 524. The drain electrode 575 and the source electrode 573 are disposed over the gate electrode 524. The drain electrode 575 includes a wide end portion 579 overlaps the storage electrode line 533 to form a storage capacitor Cst. Alternatively, the wide end portion 579, for example, is disposed on a center of the pixel area and has a substantially rectangular shape.

The TFT includes the gate electrode 524, the source electrode 573, the drain electrode and a protruding portion of the semiconductor layer 551. A channel of the TFT is defined between the source electrode 573 and the drain electrode 575.

The semiconductor layer 551, the ohmic contact members 563 and 565, the data line 571, the source electrode 573 and the drain electrode 575 are formed by the following method.

A silicon nitride layer (not shown), an amorphous silicon layer (not shown) and a doped amorphous silicon layer (not shown) are formed on the insulating layer having the gate line 521 and the storage electrode line 533 formed thereon. For example, the silicon nitride layer (not shown), the amorphous silicon layer (not shown) and the doped amorphous silicon layer (not shown) may be formed by a chemical vapor deposition (CVD) method.

A photosensitive organic material is coated on the doped amorphous silicon layer by a sputtering method. The photosensitive organic material is exposed to light and developed to form a photosensitive pattern. The photosensitive pattern is used as an etching mask. The doped amorphous silicon layer and the amorphous silicon layer are etched to form an ohmic contact pattern (not shown) and the semiconductor later 551 by a dry etching method or a wet etching method using the photosensitive pattern as the etching mask.

A conductive layer (not shown) is formed on the insulating substrate 510 having the semiconductor layer 551 and the ohmic contact members formed thereon. A photosensitive film is disposed on the conductive layer. The photosensitive film is exposed to light and developed to form a photosensitive pattern. The conductive layer is dry etched or wet etched to form the data lines 571 and the drain electrode 575 by using the photosensitive pattern as an etching mask.

After removing the photosensitive pattern, the doped amorphous silicon layer is etched by dry etching or wet etching to form the ohmic contact members 563 and 565. Alternatively, before removing the photosensitive pattern, the doped amorphous silicon layer may be etched by dry etching or wet etching to form the ohmic contact members 563 and 565, and then the photosensitive pattern may be removed.

A color filter 581 is formed on the insulating substrate 510 having the data line 571 and the drain electrode 575 formed thereon. For example, the color filter 581 includes an organic layer or a pigment displaying color and a photosensitive organic material.

The color filter 581 has a first opening 583 disposed in a channel area, a second opening 585 disposed on the large end portion 579 of the drain electrode 575. When the color filter 581 is formed in the channel area, impurities from the color filter may elute through the channel area, thereby deteriorating electrical characteristics of a TFT. Therefore, the color filter preferably has the first opening 583 exposing the channel area.

An inorganic insulating layer 591 is formed on the color filter 581. When impurities elute from the color filter having a photosensitive organic material, the display quality may be deteriorated. In FIGS. 9 and 10, the inorganic insulating layer 591 completely covers the color filter 581, and also covers the first opening 583. For example, the inorganic insulating layer 191 may include a material having a low reaction rate with an organic material to prevent impurities from eluting. Examples of an inorganic insulating material that can be used for the inorganic insulating layer 191 include silicon nitride (SiNx), silicon oxide (SiOx), etc. The silicon nitride (SiNx) or the silicon oxide (SiOx) is thermally more stable than the organic material or the color filter material, thereby enhancing the display quality.

The inorganic insulating layer 591 formed on the color filter 581 has a thin and uniform thickness. For example, when the inorganic insulating layer 591 is disposed at a step portion, the thickness of the inorganic insulating layer 591 on the step portion may be slightly thinner or thicker than that in adjacent portions. In FIGS. 9 and 10, the inorganic insulating layer 591 corresponds to a profile of the step portion of the color filter 581 under the inorganic insulating layer 591.

The inorganic insulating layer 591 has a predetermined step portion according to the profile under the inorganic insulating layer 591. The inorganic insulating layer 591 covers the first opening 583 of the color filter 581 and has a similar step portion. The profile of the step portion is similar to the profile of the first opening 583.

The inorganic insulating layer 591 has an opening 593 disposed on the drain electrode 575.

The inorganic insulating layer 591 is formed by the following method.

The inorganic insulating layer 591 is formed on the insulating substrate 510 having a color filter 581 formed thereon by using a chemical vapor deposition (CVD) method. Examples of an insulating material that can be used for the inorganic insulating layer 591 include silicon nitride (SiNx), silicon oxide (SiOx), etc. The above process is performed at a temperature from about 100° C. to about 250° C. For example, the above process is performed at a temperature from about 100° C. to about 200° C.

After forming the color filter 581 and before forming the inorganic insulating layer 591, a plasma process is performed to the insulating substrate 510. For example, after red, green and blue color filters of the color filter 581 are formed, the plasma process is performed to the insulating substrate 510. When the insulating substrate 510 having the color filters 581 formed thereon is disposed in a chamber, plasma is generated in the chamber having a supply gas such as hydrogen ($H_2$) or ammonia ($NH_3$). Through the plasma process, impurities in the channel area may be removed to thereby enhance electrical characteristics of the TFT.

The inorganic insulating layer 591 is formed by a deposition process. When the thickness of the inorganic insulating layer 591 is greater than about 1 μm, a manufacturing time may be increased. In FIGS. 9 and 10, the thickness of the inorganic insulating layer 591 is ranged from about 100 Å to about 2,000 Å, and manufacturing costs and time may be decreased.

The inorganic insulating layer 591 is patterned to form the opening 593. The opening 593 partially expose a wide end portion of the drain electrode 575. Openings (not shown) exposing the gate pad and the data pad are simultaneously formed with the opening 593. Also, the opening of the gate insulating layer 541 on the gate pad may be simultaneously formed with the opening 593.

The pixel electrode 597 is formed on the inorganic insulating layer 591.

The pixel electrode 597 is not formed in a region where the first opening 583 of the color filter 581 is formed. When the pixel electrode 597 is formed at the first opening 583, a parasitic capacitor may be formed between the pixel electrode 597 and the TFT, thereby deteriorating electrical characteristics of the TFT.

The pixel electrode 597 is electrically connected to the wide end portion 579 of the drain electrode 575 through the second opening 597 of the color filter 581 and the opening 593 of the inorganic insulating layer 591.

Figure 11:
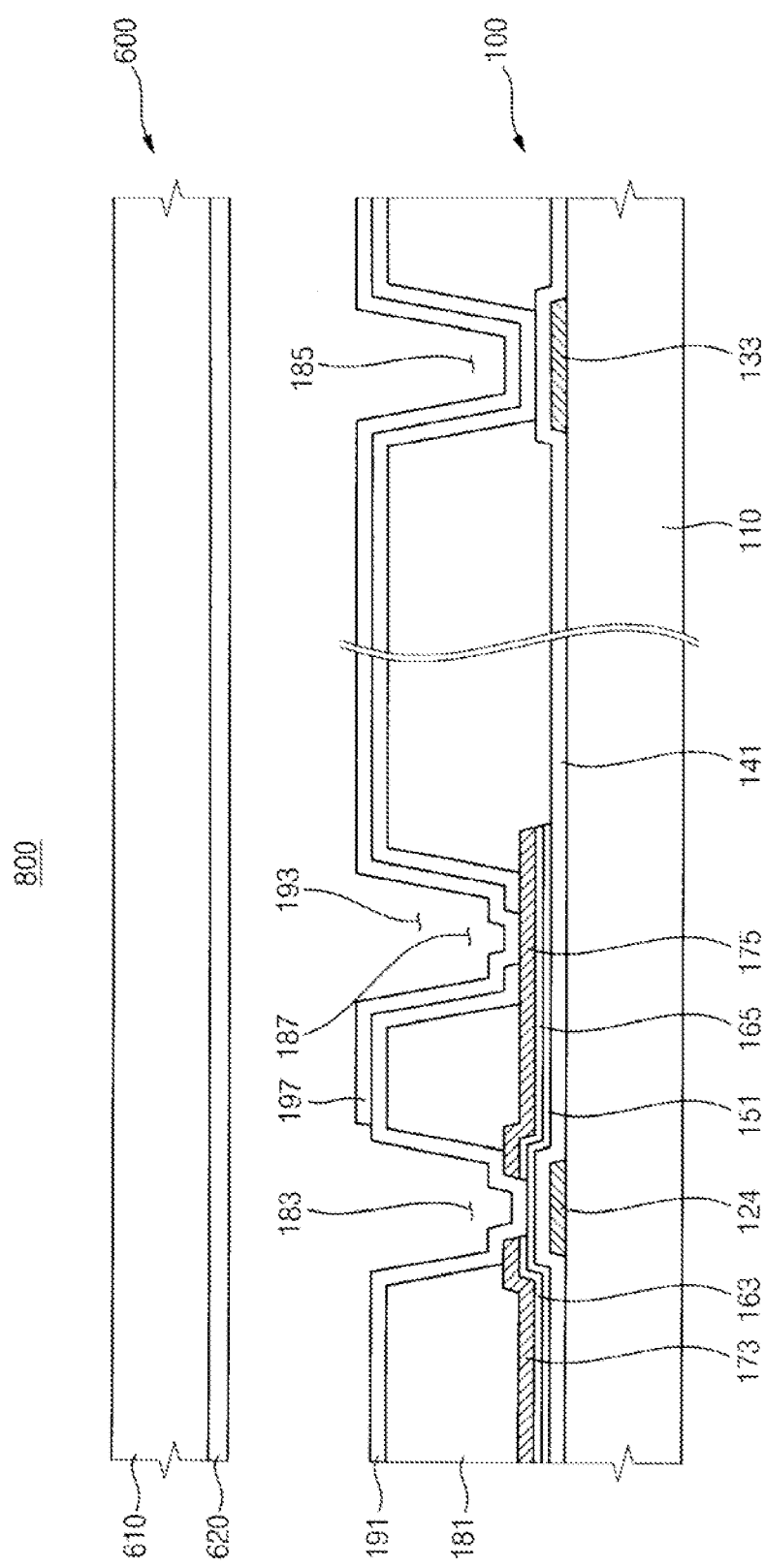
FIG. 11 is a cross-sectional view illustrating a display apparatus in accordance with an example embodiment of the present invention.

In FIGS. 10 and 11, a pixel electrode 597 has an incision pattern. The incision pattern distorts electric fields to change a direction of liquid crystal domains of a liquid crystal layer formed on the pixel electrode 597. The incision pattern may have various shapes. Further, the pixel electrode 597 may be formed such that the pixel electrode 597 does not overlap the gate lines 521 and the data lines 571.

The pixel electrode 597 is formed by the following method. A transparent conductive layer is formed on the insulating substrate 510 having an inorganic insulating layer 591 formed thereon by using a sputtering method. Examples of a transparent conductive material that can be used for the transparent conductive layer include indium zinc oxide (IZO), indium tin oxide (ITO), etc. These can be used alone or in a combination thereof. The transparent conductive layer is patterned through a photolithography process to form the pixel electrode 597.

According to the fourth example embodiment of the present invention, the storage capacitor may be defined by the wide end portion of the drain electrode and the storage electrode.

FIG. 11 is a cross-sectional view illustrating a display apparatus in accordance with an example embodiment of the present invention.

Referring to FIG. 11, a display apparatus 800 in accordance with one example embodiment of the present invention includes a TFT substrate 100, a common electrode substrate 600 and a liquid crystal layer (not shown) disposed between the TFT substrate 100 and the common electrode substrate 600.

The TFT substrate 100 of FIG. 11 is same as in FIGS. 1 and 2. Thus, the same reference numerals will be used to refer to the same or like parts as those described in FIGS. 1 and 2 and any further explanation concerning the above elements will be omitted.

The common electrode substrate 600 includes an insulating substrate 610 and a common electrode 620 disposed on the insulating substrate 610.

The common electrode 620 includes a transparent conductive material. Examples of the transparent conductive material that can be used for the common electrode 620 include indium zinc oxide (IZO), indium tin oxide (ITO), etc. These can be used alone or in a combination thereof.

The liquid crystal layer (not shown) is disposed between the TFT substrate 100 and the common electrode substrate 600.

Examples of liquid crystal mode of the liquid crystal layer include a patterned vertical alignment (PVA) mode, a twisted nematic (TN) mode, an optically compensated bend (OCB) mode, etc. According to the liquid crystal mode, liquid crystal molecules are arranged vertically or horizontally.

According to a TFT substrate and a display apparatus of the present invention, an inorganic insulating layer is disposed on a color filter. Thus, impurities from the color filter may be blocked, so that contamination of the liquid crystal may be prevented, thereby reducing defects such as afterimages.

According to a method of manufacturing the TFT substrate of the present invention, an inorganic insulating layer is formed at a low temperature of about 100° C. to about 250° C. Thus, damage to a lower color filter may be prevented and display quality may be enhanced.

Furthermore, according to the method of manufacturing the TFT substrate of the present invention, the thickness of the inorganic insulating layer is optimized to decrease the manufacturing time of the TFT substrate.

Although example embodiments of the present invention have been described herein with reference to the accompanying drawings, it is to be understood that the present invention should not be limited to those precise embodiments and that various other changes and modifications may be made by one of ordinary skill in the related art without departing from the scope or spirit of the invention. All such changes and modifications are intended to be included within the scope of the invention as defined by the appended claims.

What is claimed is:

1. A thin-film transistor (TFT) substrate comprising:
   a substrate;
   a gate electrode formed on the substrate and electrically connected to a gate line;
   a gate insulating layer formed on the substrate to cover the gate line and the gate electrode;
   a semiconductor layer formed on the gate insulating layer corresponding to the gate electrode;
   a source electrode formed on the semiconductor layer and electrically connected to a data line formed on the gate insulating layer in a direction crossing a longitudinal direction of the gate line;
   a drain electrode formed on the semiconductor layer opposite to the source electrode to define a channel area of the semiconductor layer between the source and drain electrodes;
   an organic layer formed on the gate insulating layer to cover the source electrode, the drain electrode and the data line, the organic layer having a first opening exposing the channel area;
   an inorganic insulating layer formed on the organic layer and an inner surface of the first opening, the inorganic insulating layer having a substantially uniform thickness; and
   a pixel electrode disposed on the inorganic insulating layer and contacting the drain electrode through a contact hole formed through both the organic layer and the inorganic insulating layer.

2. The TFT substrate of claim 1, further comprising a storage electrode formed of material from a same layer as that from which the gate line is formed, and wherein the organic layer has a second opening exposing a portion of the gate insulating layer disposed on the storage electrode.

3. The TFT substrate of claim 2, wherein the inorganic insulating layer is formed on an inner side surface of the second opening and the gate insulating layer exposed through the second opening.

4. The TFT substrate of claim 2, further comprising at least one spacer disposed at and filling up at least one of the first and second openings.

5. The TFT substrate of claim 4, wherein the spacer includes a light blocking material.

6. The TFT substrate of claim 2, further comprising a light blocking filler disposed at and filling up at least one of the first and second openings.

7. The TFT substrate of claim 1, wherein the pixel electrode is not present in the first opening.

8. The TFT substrate of claim 7, wherein the pixel electrode has an incision pattern dividing one pixel part into a plurality of domains.

* * * * *